United States Patent
Asam

(10) Patent No.: US 6,973,293 B2
(45) Date of Patent: Dec. 6, 2005

(54) APPARATUS AND METHOD FOR COMPENSATING FOR THE OFFSET OF A MIXER

(75) Inventor: Michael Asam, Wollomoos (DE)

(73) Assignee: Infineon Technologies AG, Munich (DE)

( * ) Notice: Subject to any disclaimer, the term of this patent is extended or adjusted under 35 U.S.C. 154(b) by 596 days.

(21) Appl. No.: 10/243,064

(22) Filed: Sep. 13, 2002

(65) Prior Publication Data

US 2003/0054786 A1    Mar. 20, 2003

Related U.S. Application Data

(63) Continuation of application No. PCT/EP01/02757, filed on Mar. 12, 2001.

(30) Foreign Application Priority Data

Mar. 13, 2000    (EP) ................................. 00105232

(51) Int. Cl.$^7$ ................................................. H04B 1/04

(52) U.S. Cl. ..................... 455/114.2; 455/119; 455/126; 455/334; 327/155

(58) Field of Search ............................... 455/313, 314, 455/334, 118, 119, 209, 316, 114.1, 114.2, 455/126, 109; 375/301; 327/146, 155

(56) References Cited

U.S. PATENT DOCUMENTS

| | | | | |
|---|---|---|---|---|
| 3,644,831 A | * | 2/1972 | Latker et al. | 455/119 |
| 5,033,110 A | | 7/1991 | Harman | |
| 5,584,068 A | * | 12/1996 | Mohindra | 455/324 |
| 5,661,765 A | * | 8/1997 | Ishizu | 455/260 |
| 5,802,463 A | * | 9/1998 | Zuckerman | 455/318 |
| 6,351,500 B2 | * | 2/2002 | Kumar | 375/301 |
| 2003/0045263 A1 | * | 3/2003 | Wakayama et al. | 455/323 |

FOREIGN PATENT DOCUMENTS

| DE | 197 43 272 C1 | 2/1999 |
|---|---|---|
| EP | 0 201 092 A2 | 12/1986 |

* cited by examiner

Primary Examiner—Lana Le
(74) Attorney, Agent, or Firm—Laurence A. Greenberg; Werner H. Stemer; Ralph E. Locher

(57) ABSTRACT

An apparatus and a method compare the output signal of a mixer in a detector with one of two input signals of the mixer, in order to compensate for the offset of a mixer or modulator. The detector determines the sign of the offset of the mixer. A compensation value is formed in an actuator unit by successive approximation. The value is transmitted to the mixer. In an advantageous embodiment of the invention, a simple phase detector (PD) is used to determine the offset sign (VZ). The above-described indirect measuring method functions with very high accuracy, even at only a very small offset. Offsets in the circuits preceding the mixer (MI1) are compensated for simultaneously. A manual or individual calibration of direct voltage offsets is therefore unnecessary.

10 Claims, 1 Drawing Sheet

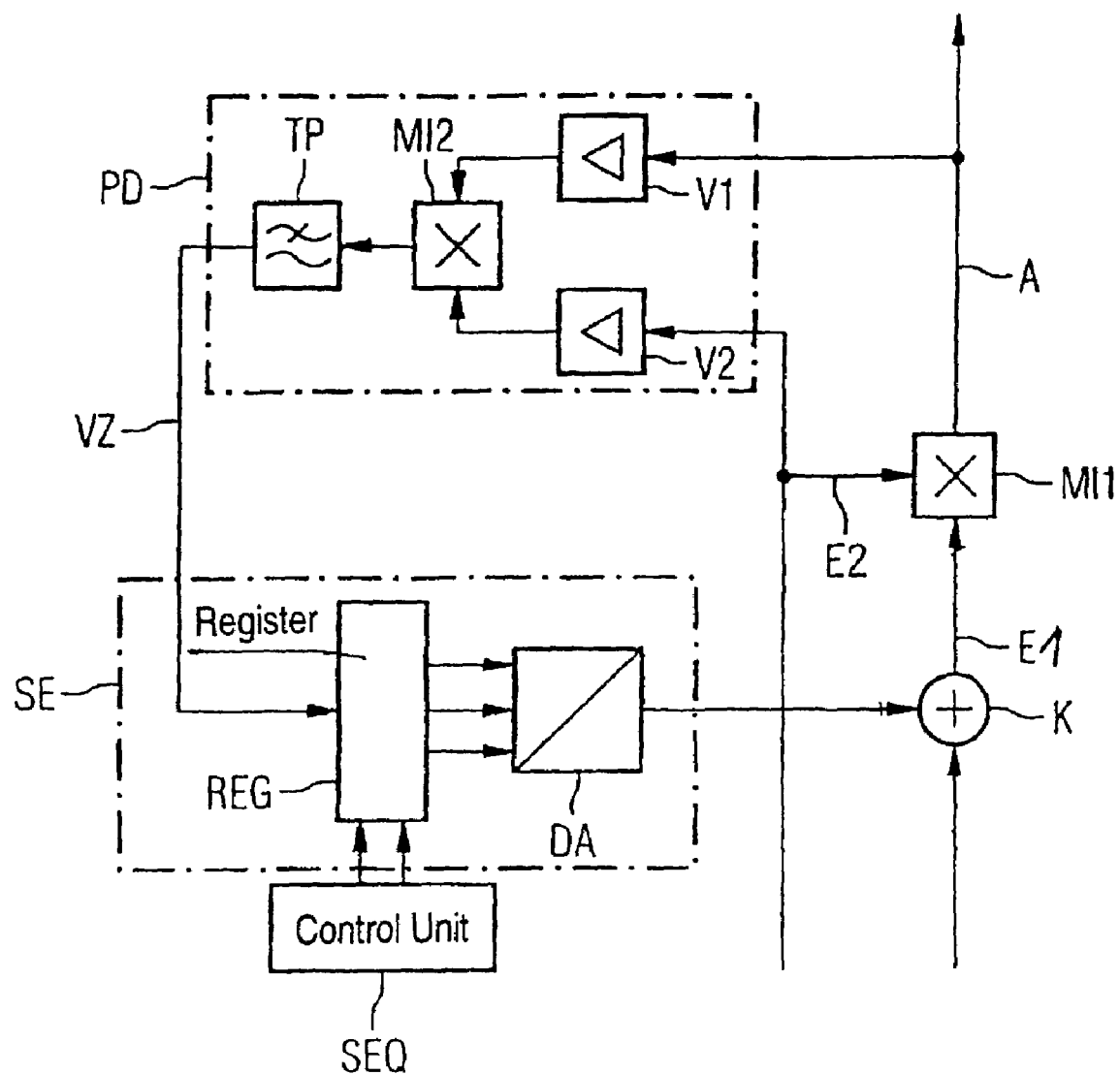

APPARATUS AND METHOD FOR COMPENSATING FOR THE OFFSET OF A MIXER

CROSS-REFERENCE TO RELATED APPLICATION

This application is a continuation of copending International Application No. PCT/EP01/02757, filed Mar. 12, 2001, which designated the United States and was not published in English.

BACKGROUND OF THE INVENTION

Field of the Invention

The present invention relates to an apparatus and a method for compensating for the offset of a mixer.

In analog integrated circuits, for instance in mobile radio applications, the problem often exists that in mixers and modulators, internal or external component tolerances cause direct voltage offsets at the input to the mixer and modulators. As a result, a carrier signal fed into the input is present at the output of the mixer or modulator. The carrier signal is undesired there, because it can generate undesired signals (spurious signals) or, in the case of quadrature modulators for digital types of modulation, such as FSK, it can cause an offset in the IQ graph.

Direct voltage offsets in mixers or modulators also can occur in circuits preceding mixers or modulators. In mobile radio, considerable offsets typically already occur in the base band component. These offsets can adversely affect downstream quadrature modulators of the transmission path. Large direct voltage offsets can occur for instance in the digital/analog converters of the base band component.

A direct measurement of the offset, which is typically very slight and may amount to only a few millivolts, such as a flash measurement, is unsuited to practical conversion. Such a measurement is unsuited because the measurement apparatus to be employed would itself have to be offset-free.

One known way of compensating for the above-described direct voltage offsets is to measure the unwanted carrier signal at the output of the applicable mixer or modulator, and programming an opposite offset for the digital/analog converters of the base band component, so that the direct voltage offset is compensated for in the mixer or modulator.

However, it is expensive and complicated to convert a carrier signal amplitude, which is to be measured at the output, into an offset compensation value to be applied to the input.

If the offset compensation is employed in transmission paths in the mobile radio field, the unwanted carrier is measured for instance at the antenna of a mobile radio set. It is evident that this individual measurement of the offset entails major measurement effort and expense. Considerable costs are incurred as a result of the time to be spent, the measurement equipment to be furnished, and the requisite labor force. Other disadvantages of this standard version are that the programmed opposed offset in the digital/analog converters narrows their modulation range, reduces their modulation, and increases noise.

Another known way of reducing problematic carrier signals at the output of mixers or modulators is to incorporate additional filters. However, integrating additional filters requires chip surface area and the furnishing of an energy supply. Moreover, integrating additional filters involves additional costs. Disposing the additional filters in external components necessitates additional pins at the semiconductor components. In quadrature modulators, the use of additional filters is not possible, since the problematic carrier frequency at the output is within the useful band of the modulator.

Still another known way of reducing the offset in mixers or modulators is to reduce or avoid incorrect adaptations in the semiconductor component. However, this requires large-area components, such as resistors or parallel transistors, which disadvantageously increases the surface area required in the entire circuit.

In the mobile radio field, both the dimensions and weight of circuits, along with cost aspects, are important development targets.

In commonly-owned German Patent No. DE 197 43 272 C1, an apparatus and a method for compensating for the offset of a mixer is disclosed. The circuit has a first integrated circuit, with a mixer and an actuator unit for generating an offset compensation value, and a bus, to which a second integrated circuit is connected. In this circuit, the offset is detected. This circuit is suitable for use for instance in a reception path in mobile radio. In this described apparatus, measuring the offset is complicated; moreover, high demands in terms of accuracy must be made of this offset detection. For returning the offset to the actuator unit, a bus with three conductors is provided.

SUMMARY OF THE INVENTION

It is accordingly an object of the invention to provide an apparatus and a method for compensating for the offset of a mixer that overcome the hereinafore-mentioned disadvantages of the heretofore-known devices of this general type and that compensate for the offset of a mixer with little effort, reduce expense, and reduce demand for chip surface area.

With the foregoing and other objects in view, there is provided, in accordance with the invention, an apparatus that compensates for the offset of a mixer. The apparatus includes a first mixer with a first input, a second input, and an output. A detector is connected to the output of the first mixer. The sign of the offset is applied to the output of the detector. An actuator unit generates an offset compensation value to which the sign of the offset can be supplied, and which is coupled to the first mixer. A control unit, which is connected to the actuator unit, controls the generation of various offset compensation values.

With the objects of the invention in view, there is also provided a method for compensating for the offset of a mixer. The method includes the following steps. The first step is determining the sign of a direct voltage offset of a first mixer by comparison of a signal, present at one input of a first mixer, with a signal that can be derived at an output of the first mixer. The next step is incrementally setting bits in an actuator unit, beginning with a most significant bit. The next step is forming an offset compensation value in the actuator unit, and carrying the offset compensation value to the first mixer. The next step is retracting the most recently set bit, if by setting it, a change in the sign occurs. The next step is allowing the most recently set bit to stand, if by setting it no change in the sign occurs.

In the detector that is connected to the first mixer, only the sign of the offset that is detected, not the offset itself. This sign of the offset can be delivered to an actuator unit. At the output of the actuator unit, an offset compensation value is present, which can be delivered to the first mixer. The offset compensation value generated in the actuator unit is increased incrementally, using the known method of successive approximation. If the sign of the offset changes in the process, then the offset is overcompensated. The detector can detect a change in the sign of the offset. In that case, the offset compensation value must be reduced.

A control unit enacts the sequence control of the approximation method for compensation. The control unit is connected to the actuator unit.

Because the offset itself is not to be detected, but only its sign, the structure of the detector is quite simple. The demands in terms of adaptation of the additional circuit and in terms of the accuracy of the detector are low and therefore can be achieved in a very space-saving way. The measurement of only the sign enables very high-accuracy calibration, even if the offsets are quite small. Because incorrect adaptations in mixers and modulators now can be calibrated, the structural size of the mixers and modulators can be reduced. Crosstalk, generated either in internal lines or by the housing, is compensated for simultaneously by the described circuit. Compared to the calibration of the equipment described at the outset by establishing an offset at the digital/analog converters of the base band component, which is done only a single time during manufacture, the described calibration can be performed at regular intervals or as needed, for instance when the equipment is turned on. This makes it possible to compensate even for parameters that vary over time and their effects, which are manifested in an offset. For example, the offset to be compensated for can depend on aging of the equipment, on the temperature, or on the battery voltage.

If the described circuit is disposed in a transmission path in mobile radio applications, offsets that occur in the circuits preceding the mixer or modulator are compensated for simultaneously. For example, the offsets of the digital/analog converters of the base band component are compensated for simultaneously, so that in these converters, the full number of bits and thus the full modulation range is available. The good noise properties of the converters are preserved as a result. Because the offset compensation now proceeds automatically, performing an individual or manual calibration of the offset is not needed. This makes savings possible in terms of the measurement outfitting, labor expense, and time for production. Moreover, the circuit described obviates incorporating additional filters for filtering out undesired signals that could be produced by offsets or carrier crosstalk.

In an advantageous embodiment of the present invention, the detector is a phase detector. If the carrier signal has a positive offset, then the carrier signal at the output is in phase with that at the input. If the offset is negative, the carrier at the output has a phase that is displaced by 180° compared to the carrier at the input. From the phase relationship of the signals to one another, an unambiguous conclusion can be drawn as to the sign of the offset. The phase detector can be embodied as a simple mixer with a low-pass filter disposed downstream. The direct voltage signal present at the output of the detector has a sign that is identical to the sign of the offset to be compensated for.

In a further advantageous embodiment of the invention, the mixer of the phase detector can be embodied as a simple Gilbert cell.

In an advantageous embodiment of the invention, the actuator unit for generating the offset compensation value has both a register and a digital/analog converter.

Other features that are considered as characteristic for the invention are set forth in the appended claims.

Although the invention is illustrated and described herein as embodied in an apparatus and a method for compensating for the offset of a mixer, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE is a block diagram showing an apparatus for compensating for the offset of a mixer according to the invention.

DESCRIPTION OF THE PREFERRED EMBODIMENTS

Referring now to the single FIGURE of the drawing, a mixer MI1 has two inputs E1, E2 and one output A. Connected to the output A is a phase detector PD, which is connected to the second output E2 of the mixer MI1. The phase detector PD is connected to an actuator unit SE, which in turn is connected, via an adder node K, to the first input E1 of the mixer MI1. The phase detector PD has two amplifiers V1, V2, to which the input signals of the phase detector can be supplied. The first amplifier V1 is connected to the output A of the first mixer MI1. The amplifier V2 is connected on the input side to the second input E2 of the first mixer MI1. The first amplifier V1 and the second amplifier V2 are connected on the output side to two inputs of a second mixer MI2, whose output is connected to the input of a low-pass filter TP. The output of the low-pass filter TP is connected to the input of a register REG in the actuator unit SE. The register REG is connected by many lines to a digital/analog converter DA. The output of the digital/analog converter DA is connected to one input of an adder node, whose output is connected to the input E1 of the first mixer. A sequencer SEQ is connected to the register REG of the actuator unit SE.

The mixer MI1 may have an undesired direct voltage offset that must be compensated for. If the first mixer MI1 has a direct voltage offset on the input side, the result is that a carrier signal, which can be applied for instance to the second input E2, is detectable at the output A of the first mixer MI1. The direct voltage offset on the input side of the first mixer MI1, which multiplies the signals applied to the inputs E1, E2, can be positive or negative. The phase detector PD compares the output signal of the first mixer MI1 to the signal that can be supplied to the second input of the first mixer MI1. Depending on whether the direct voltage offset on the input side of the first mixer MI1 has a positive sign or a negative sign, a direct voltage signal with a positive or negative sign VZ is present at the output of the phase detector PD. The phase detector PD detects the sign of the offset in such a way that it compares the phase relationships of the signal, present at the output A of the first mixer MI1, with the signal present at the second input E2 of the first mixer MI1. Depending on the sign of the offset at the first mixer MI1, a phase difference of either 0° or 180° prevails between the signals that can be supplied to the first and second amplifiers V1, V2. The second mixer MI2 can for instance be embodied as a simple Gilbert cell for multiplying two signals. At the output of the low-pass filter TP, a direct voltage level can be picked up whose sign is the same as the offset to be compensated for. At the output of the digital/analog converter, the actuator unit SE generates a compensation value to compensate for the offset of the first mixer MI1, using the principle of successive approximation, also known as the weighing method. At the beginning, the number to be generated is set to 0, and then each bit is individually set to 1 in succession, from the most significant bit (MSB) to the least significant bit (LSB), and retracted if overcompensation has been done, or in other words if the sign VZ when a new bit is set has changed its sign. The current number at a given time that includes the bits from the most significant to the least significant is stored in memory in the register REG. The sequence over time as described is controlled by a sequencer SEQ. The two amplifiers V1, V2 have the effect that even slight offsets are detectable and can be compensated for. If for instance a carrier signal is present at the second input of the first mixer MI1, and if the first input E1 of the first mixer MI1 is signal-free (balanced) but has a direct voltage offset, then the carrier signal is also present at the output A of the first mixer MI1. If the offset at the first input E1 is negative, then the carrier signal at the output A has a phase displaced by 180° from the carrier signal at the second input E2; if the offset at the first input E1 is positive, then the phase displacement between the second input E2 and the output A is 0°. The disposition of the phase detector means that slight phase displacements between the signals that can be applied to the two amplifiers V1, V2 will have no effect at the output of the phase detector PD.

The requirements in terms of matching, noise, etc., that must be made of the sign detector PD are slight. The phase detector PD can therefore be achieved at relatively little expense and on a small chip area.

The indirect offset measurement described, by measurement at the output of the first mixer MI1, also compensates for carrier crosstalk, which can be caused for instance by line crosstalk or housing crosstalk.

The apparatus described makes it possible even to compensate for direct voltage offsets that occur in the circuitry upstream of the first mixer MI1, for instance in the digital/analog converters of a base band component preceding the mixer, in the case of use in mobile radio.

The offset to be compensated for can depend on environmental parameters, such as temperature or battery voltage, but can also depend on aging processes. The circuit configuration described makes an automatic calibration or an automatic offset compensation possible, for instance, when the equipment in which the circuit is located is switched on, so that a temperature drift, for instance, can be compensated for. The one-time calibration typically performed during manufacture does not achieve this.

The method of successive approximation guarantees a very high accuracy of compensation, even at very low offset values.

In modifications of the exemplary embodiment described, the compensation apparatus is also suitable for modulators that can be used instead of the first mixer MI1.

The offset compensation value itself can be realized for instance by using switchable current sources or voltage sources, not shown, that can be connected to the digital/analog converter DA.

The circuit configuration described can be used for instance in single-chip transceivers in GSM mobile radio applications. In such applications, a quadrature modulator is provided downstream of the base band component, and the DC offsets of this modulator can thus be compensated for. Because in single-chip transceivers, sequencers are typically already provided for control purposes, all that is needed for performing the method of the invention is the integration of a register and a sign detector.

I claim:

1. An apparatus to compensate for mixer offset of signals, comprising:
    a mixer receiving a signal at a first input and a second input, and outputting the signal with an offset having a sign at an output;
    a detector connected to said output of said mixer and having an output, said output of said detector having the sign of the offset applied thereto;
    an actuator unit for generating an offset compensation value to be supplied with the sign of the offset and coupled to said mixer; and
    a control unit connected to said actuator unit for controlling the generation of the offset compensation value.

2. The apparatus according to claim 1, wherein said detector is a phase detector.

3. The apparatus according to claim 2, wherein said phase detector has a first and a second amplifier, each with a respective output, a further mixer connected to said outputs of said first and said second amplifier, and a low-pass filter connected downstream of said further mixer.

4. The apparatus according to claim 3, wherein said further mixer is a Gilbert multiplier.

5. The apparatus according to claim 1, wherein said actuator unit has a register and a digital/analog converter connected to said register.

6. The apparatus according to claim 5, wherein said actuator unit has switchable current sources.

7. The apparatus according to claim 5, wherein said actuator unit has switchable voltage sources.

8. A method to compensate for an offset of the mixer, which comprises the following steps:
    determining a sign of a direct voltage offset of a mixer by comparing a signal at an input of the mixer with a signal derived at an output of the mixer;
    incrementally setting bits in an actuator unit beginning with a most significant bit;
    forming an offset compensation value in the actuator unit, and supplying the offset compensation value to the mixer;
    retracting the most recently set bit if a change the of sign in the direct voltage offset of the mixer occurred in the incrementally-setting step; and
    retaining the most recently set bit if no change of the sign in the direct voltage offset of the mixer occurred.

9. The method according to claim 8, which further comprises deriving the sign of the direct voltage offset by comparing phase relationships of the signal at the output of the mixer and the signal at the input of the mixer.

10. The method according to claim 9, which further comprises:
    setting the sign of the direct voltage offset of the mixer equal to 1 if phase relationships of the signals have a difference of 0°; and
    setting the sign of the direct voltage offset of the mixer equal to −1 if the difference between the phase relationships of the signals is 180°.

* * * * *